(12) United States Patent
Cathelin et al.

(10) Patent No.: US 7,282,803 B2
(45) Date of Patent: Oct. 16, 2007

(54) INTEGRATED ELECTRONIC CIRCUIT COMPRISING A CAPACITOR AND A PLANAR INTERFERENCE INHIBITING METALLIC SCREEN

(75) Inventors: Andréa Cathelin, Laval (FR);
Christophe Bernard, Claix (FR);
Philippe Delpech, Meylan (FR); Pierre Troadec, Grenodle (FR); Laurent Salager, Domene (FR); Christophe Garnier, Theys (FR)

(73) Assignee: STMicroelectronics S. A., Montrouge (FR)

( * ) Notice: Subject to any disclaimer, the term of this patent is extended or adjusted under 35 U.S.C. 154(b) by 4 days.

(21) Appl. No.: 10/513,453

(22) PCT Filed: May 2, 2003

(86) PCT No.: PCT/FR03/01372

§ 371 (c)(1),
(2), (4) Date: Jun. 23, 2005

(87) PCT Pub. No.: WO03/096420

PCT Pub. Date: Nov. 20, 2003

(65) Prior Publication Data

US 2005/0242438 A1 Nov. 3, 2005

(30) Foreign Application Priority Data

May 7, 2002 (FR) .................................. 02 05712

(51) Int. Cl.
*H01L 23/48* (2006.01)
*H01L 23/58* (2006.01)
*H01L 23/66* (2006.01)
*H01L 27/04* (2006.01)

(52) U.S. Cl. .............................. 257/758; 257/E27.108; 257/E27.098; 257/E23.144; 257/E27.11; 257/E27.107; 257/E27.081; 257/E27.097; 257/532; 257/774; 257/776; 257/700; 257/701; 257/757; 257/906; 257/296; 257/303; 257/68; 257/71; 257/528

(58) Field of Classification Search ........ 257/E27.108, 257/E27.098, E23.144, E27.11, E27.107, 257/E27.081, E27.097, 758, 532, 774, 776, 257/528, 700, 701, 773, 756, 200, 906, 303, 257/68, 71
See application file for complete search history.

(56) References Cited

U.S. PATENT DOCUMENTS 5,151,769 A 9/1992 Immorlica
(Continued)

FOREIGN PATENT DOCUMENTS

EP 0 353 426 2/1990

OTHER PUBLICATIONS

European Patent Office Communication, 03 749 913.4, dated Apr. 5, 2006.
International Search Report, PCT/FR03/01372, dated Sep. 2, 2003.

*Primary Examiner*—Alexander Oscar Williams
(74) *Attorney, Agent, or Firm*—Gardere Wynne Sewell LLP

(57) ABSTRACT

An electronic circuit includes a substrate. A capacitor and at least one semiconductor component are supported by a surface of the substrate. A substantially planar screen, oriented parallel to the surface of the substrate and made of metallic material, is placed between the capacitor and the semiconductor component. Preferably, the semiconductor component is placed in proximity to the surface of the substrate and several superposed layers of insulating material cover the surface of the substrate and the semiconductor component. The capacitor is then placed within at least one layer of insulating material above the semiconductor component, and the screen is placed within an intermediate layer of insulating material between the layer incorporating the capacitor and the surface of the substrate.

29 Claims, 1 Drawing Sheet

U.S. PATENT DOCUMENTS

| | | | |
|---|---|---|---|
| 5,571,740 A | 11/1996 | Peterson | |
| 6,128,768 A | 10/2000 | Ho | |
| 6,147,857 A * | 11/2000 | Worley et al. | 361/301.2 |
| 6,215,144 B1 * | 4/2001 | Saito et al. | 257/310 |
| 6,236,101 B1 * | 5/2001 | Erdeljac et al. | 257/531 |
| 6,285,050 B1 * | 9/2001 | Emma et al. | 257/296 |
| 6,383,916 B1 * | 5/2002 | Lin | 438/637 |
| 6,406,778 B1 * | 6/2002 | Natarajan et al. | 428/209 |
| 6,735,755 B2 * | 5/2004 | Shau | 716/16 |
| 6,900,541 B1 * | 5/2005 | Wang et al. | 257/758 |
| 6,909,589 B2 * | 6/2005 | Huff | 361/281 |
| 6,933,673 B2 * | 8/2005 | Yamazaki | 313/506 |
| 7,126,200 B2 * | 10/2006 | Seyyedy et al. | 257/421 |
| 7,154,158 B2 * | 12/2006 | Kikuta et al. | 257/516 |
| 2001/0020713 A1 | 9/2001 | Yoshitomi et al. | |
| 2002/0119622 A1 * | 8/2002 | Steigerwald et al. | 438/244 |
| 2003/0015801 A1 * | 1/2003 | Nakajima et al. | 257/758 |
| 2003/0160267 A1 * | 8/2003 | Iwasaki et al. | 257/200 |
| 2004/0021159 A1 * | 2/2004 | Matsuoka et al. | 257/296 |
| 2004/0113752 A1 * | 6/2004 | Schuster | 338/310 |
| 2004/0114075 A1 * | 6/2004 | Iwasa | 349/113 |
| 2004/0150939 A1 * | 8/2004 | Huff | 361/277 |
| 2004/0224473 A1 * | 11/2004 | Chua et al. | 438/313 |
| 2004/0262031 A1 * | 12/2004 | Gill et al. | 174/252 |
| 2006/0103031 A1 * | 5/2006 | Wu | 257/781 |
| 2007/0037394 A1 * | 2/2007 | Su et al. | 438/687 |

* cited by examiner

ABSTRACT
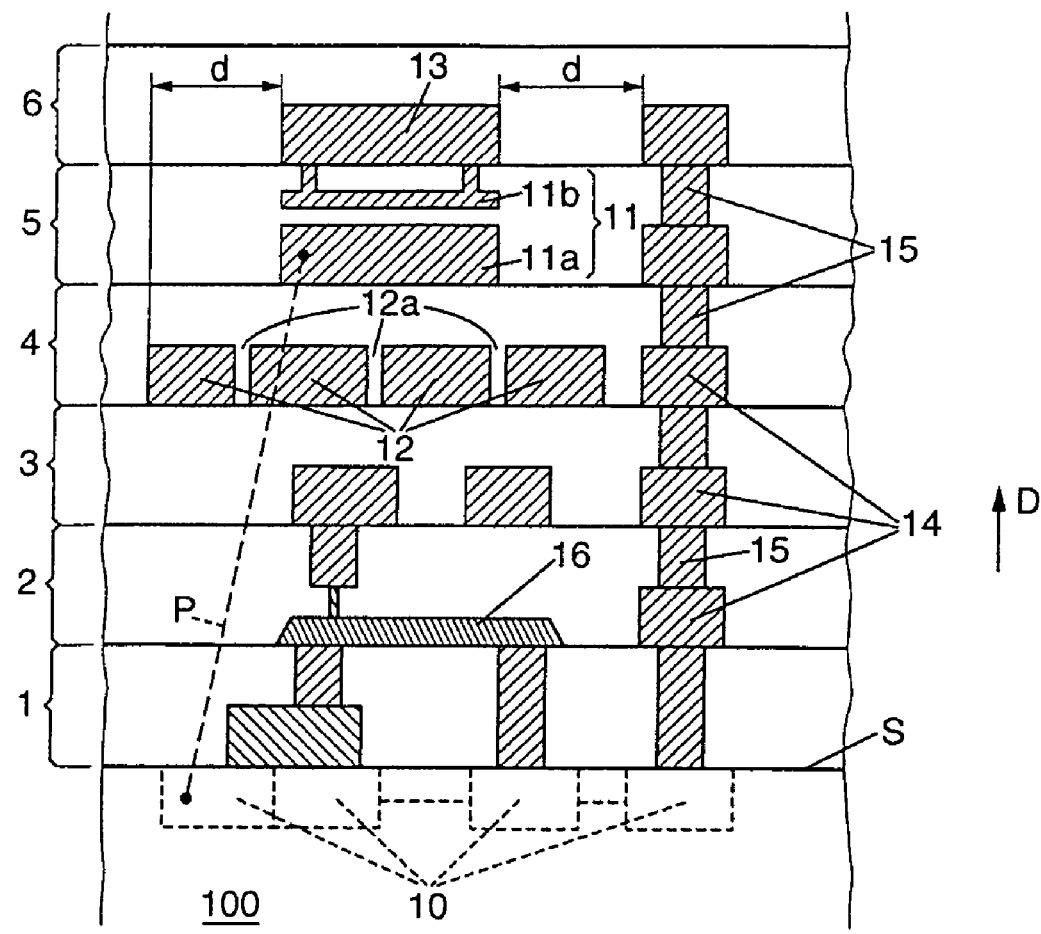

INTEGRATED ELECTRONIC CIRCUIT COMPRISING A CAPACITOR AND A PLANAR INTERFERENCE INHIBITING METALLIC SCREEN

PRIORITY CLAIM

The present application claims priority from, and is a nationalized filing of PCT Application PCT/FR03/01372, filed May 2, 2003, which claims priority from French Application for Patent No. 02 05712 filed May 7, 2002, the disclosures of which are hereby incorporated by reference.

BACKGROUND OF THE INVENTION

1. Technical Field of the Invention

The present invention relates to an integrated electronic circuit comprising at least one capacitor, and more particularly to an integrated circuit in which the operation of a capacitor is liable to be disturbed by semiconductor components placed in proximity to the capacitor, or vice versa.

2. Description of Related Art

Electronic circuits intended for many applications comprise first capacitors having essentially planar metal plates, in addition to other semiconductor components, such as transistors, diodes and resistors, or, possibly, second capacitors of a type different from the first capacitors. The essentially planar metal plates that constitute said first capacitors are substantially parallel to the surface of the substrate and may have relatively large geometrical dimensions such as, for example, sides of approximately 50 microns. Hereafter, "capacitors" denotes said first capacitors having essentially planar metal plates, it being understood that second capacitors, such as those introduced above, may be present among said semiconductor components.

These capacitors may be placed on the surface of the substrate, alongside the semiconductor components. The expression "arrangement of the capacitors alongside the semiconductor components" is understood to mean a configuration in which a first part of the surface of the substrate supports the semiconductor components and a second part of the same surface of the substrate, separate from the first part, supports the capacitors. The area of the substrate occupied by the circuit is therefore large. The cost of the electronic circuit is therefore high.

Another possible configuration consists in placing the capacitors above the semiconductor components produced on the surface of the substrate within the layers of insulating material which cover the surface of the substrate and the semiconductor components. The expression "arrangement of the capacitors above the semiconductor components" is understood to mean a configuration in which the capacitors are superposed on the semiconductor components on top of the surface of the substrate which supports them. A major saving in substrate area results from this configuration compared with the previous configuration, thereby allowing, a consequent reduction in the cost of the corresponding electronic circuits.

Moreover, it is known that capacitors having dimensions like those mentioned above are particularly sensitive to electrical and/or electromagnetic interference. This is especially the case in electronic circuits referred to as "analog" circuits. The term "analog circuits" is understood to mean electronic circuits which operate with signals corresponding to frequencies of less than about 10 megahertz. Such circuits are found for example in mobile communication terminals. These are especially power management units or analog signal-processing circuits, such as filters, amplifiers, regulators, comparators, and the like. When the capacitors are placed above semiconductor components, the latter generate interference which disturbs the operation of the capacitors. Conversely, the capacitors may also disturb the operation of the components above which they are placed. Such interference is connected with the short distances that separate the capacitors from the semiconductor components when they are superposed with the latter.

There is a need for the superposition of capacitors and semiconductor components on top of a surface of a substrate in a manner which prevents reciprocal interference of the respective operations of the capacitors and semiconductor components.

SUMMARY OF THE INVENTION

A first aspect of the invention thus relates to an electronic circuit that includes a substrate. A capacitor and at least one semiconductor component are supported by a surface of the substrate, wherein the capacitor and the semiconductor component are placed substantially in line with each other along a direction perpendicular to the surface of the substrate. A substantially planar screen, made of a metallic material, is placed between the capacitor and the semiconductor component parallel to the surface of the substrate.

By placing the screen between the capacitor and the semiconductor component, electronic and/or electromagnetic interference emitted by the semiconductor component is inhibited, if not stopped, by the screen. Such interference therefore does not disturb the operation of the capacitor. The same protection effect is obtained in respect of the operation of the semiconductor component with respect to interference produced by the capacitor.

It should be noted that the capacitor and the semiconductor component are said to belong to the same electronic circuit in the sense that they are supported by the same substrate. However, it should be understood that they may each belong to functionally different circuit portions, which may or may not be connected together, and that the invention is beneficial when interference with the operation of at least one of the circuit portions may result from superposing the capacitor and the semiconductor component.

To protect the operation of the capacitor more effectively, the screen may have edges located at least partly outside a projection of the edges of the capacitor in a plane containing the screen, along the direction perpendicular to the surface of the substrate. In addition, the edges of the screen may be located at least two microns from the projection of the edges of the capacitor, along a direction parallel to the direction of said plane containing the screen.

Symmetrically, for the purpose of protecting the operation of the semiconductor component more effectively, the edges of the screen may be partially located outside a projection of the edges of the semiconductor component in the plane containing the screen, along the direction perpendicular to the surface of the substrate. Likewise, the edges of the screen may also be located at least two microns from the projection of the edges of the semiconductor component along a direction parallel to the direction of said plane containing the screen.

Depending on the nature of the interference from which the screen is intended to provide protection, the screen may advantageously be electrically connected to a terminal raised to a defined electrical potential.

In a preferred embodiment of the invention, the semiconductor component is placed in proximity to the surface of the substrate, and the circuit comprises several superposed layers of insulating material which cover the surface of the substrate and the semiconductor component. The capacitor is placed within at least one of the layers of insulating material above the semiconductor component, that is to say on an opposite side of the latter to the substrate. The screen is then placed within at least one intermediate layer of insulating material between the surface of the substrate and the layer(s) of insulating material within which the capacitor is placed.

In this embodiment of the invention, the screen may be placed within a layer of insulating material adjacent (along the direction perpendicular to the surface of the substrate) to the layer(s) within which the capacitor is placed, on the same side of the latter layer as the substrate. In particular, no electrical circuit portion liable to disturb the operation of the capacitor is inserted between the screen and the capacitor.

The electronic circuit may nevertheless furthermore include metallic connections or resistors placed within additional layers of insulating material, parallel to the surface of the substrate. In this case, to maintain operation of the capacitor undisturbed by any interference produced by these metallic connections or these resistors, at least the metallic connections and the resistors in line with the capacitor are advantageously located on the opposite side of the screen to the capacitor.

A second aspect of the invention relates to a method of designing an electronic circuit comprising a capacitor and at least one semiconductor component which are placed in the arrangement described above. A plurality of prototypes are produced, each prototype comprising a substrate and a measurement capacitor of a respective defined type, the measurement capacitor being supported by a surface of the substrate. Each prototype further includes a substantially planar screen made of metallic material and placed in line with the measurement capacitor along a direction perpendicular to the surface of the substrate with the screen being placed parallel to the surface of the substrate. Measurements of respective electrical characteristics of the measurement capacitors within the plurality of prototypes are then made. Next, simulations are performed of the operation of the electronic circuit using some of the measured electrical characteristics of the measurement capacitors. These simulations may utilize at least one computer-aided design software package for electronic circuits. A selection of a type of capacitor according to the results of the simulations can then be made. Lastly, fabrication of the electronic circuit with a capacitor of the selected type occurs.

According to a preferred way of implementing the method, step c) itself comprises a first step c1) during which electrical models associated with the measurement capacitors are generated by using the measured electrical characteristics, and a second step c2) during which the simulations are performed using at least some of the electrical models generated.

Similarly, a method of designing an electronic circuit according to the invention may be implemented using prototypes each comprising a measurement semiconductor component supported by a surface of a substrate, and comprising a substantially plane screen parallel to the surface of the second substrate, made of metallic material, and placed in line with the measurement semiconductor component. The method then comprises the measuring of electrical characteristics of the measurement semiconductor components within the respective prototypes. Simulations, by means of at least one computer-aided design software package for electronic circuits, of the operation of the electronic circuit are then performed using some of the measured electrical characteristics of the measurement semiconductor components, and one type of semiconductor component is selected according to the results of the simulations, in order to fabricate the electronic circuit. In the same way as above, electrical models of the semiconductor components generated on the basis of the measured electrical characteristics may be used as intermediate elements in simulating the operation of the electronic circuit.

BRIEF DESCRIPTION OF THE DRAWINGS

A more complete understanding of the method and apparatus of the present invention may be acquired by reference to the following Detailed Description when taken in conjunction with the accompanying Drawings wherein the lone FIGURE is a cross-sectional view of an electronic circuit produced according to the invention.

DETAILED DESCRIPTION OF THE DRAWINGS

In the FIGURE, for the sake of clarity, the dimensions of the various portions of components shown are not in proportion with their actual dimensions. D denotes a direction perpendicular to the surface of the substrate. The orientation of this direction D is upwards in the figure and the words "above," "below," "lower" and "upper" used hereafter refer to this orientation.

As an example, an electronic circuit taking particular advantage of the invention forms part of a first stage of radio signal processing circuits incorporated into a mobile communication terminal. This first stage of circuits is commonly referred to as a "baseband stage." In particular, it may be a filter, the electrical operation of which is known to those skilled in the art, which may be designed to operate alternately in GSM/DCS mode or in W-CDMA mode. This type of analog circuit requires perfectly linear behavior and a very low level of interference noise which make the use of the present invention particularly favorable. For example, the circuit in question incorporates capacitors with a total capacitance of 1.7 nanofarads and 21.3 picofarads, for the circuit portions dedicated to the GSM/DCS and W-CDMA modes, respectively. These capacitors are produced in so-called MIM (Metal-Insulation-Metal) technology, which makes it possible to obtain a capacitance of 2 femtofarads per square micron of plate area. In this technology, the capacitors have plane plates placed parallel to a surface of a substrate on which they are produced. Thus, all the above capacitors each corresponding to the GSM/DCS and W-CDMA modes occupy respective substrate areas of about 1.4 and 0.04 square millimeters. It is therefore particularly advantageous for this type of electronic circuit to have these capacitors above other components supported by the substrate, so as to reduce the dimensions of the substrates used.

In accordance with the FIGURE, active or passive semiconductor components 10 are produced in a planar surface S of a silicon substrate 100. These semiconductor components are obtained in standard technologies for fabricating components such as transistors, especially in bipolar, in CMOS (Complementary Metal-Oxide-Semiconductor) and BICMOS technologies, the latter technology combining between them transistors of the two—bipolar and CMOS—types. These technologies used may be especially suitable for obtaining characteristic transistor dimensions (for example gate or base widths) of less than 0.35 microns.

Several layers of insulating material, referenced 1-6 respectively, such as silica ($SiO_2$) or silicon nitride ($SiN_X$)

layers, are superposed along the direction D. These layers 1-6 include metal connections which are, for example, tracks 14 placed parallel to the surface S, and connections 15 allowing electrical currents to flow along the direction D, these connections 15 being called vias in the jargon of those skilled in the art. These metal connections may be produced using one of the following methods: the conventional method of etching metal, for example when the metal is aluminum, the damascene method or the dual damascene method, for which the metal may in particular be copper.

Some of these layers of insulating material (layer 2 in the FIGURE) may furthermore incorporate resistors 16, each formed from a segment of material chosen for its ohmic behavior, such as, for example, tantalum nitride TaN.

A capacitor 11, of the MIM type introduced above, is incorporated into the layer 5 and located in line with some of the components 10. The capacitor 11 has a first plate 11a and a second plate 11b, these being plane and parallel to the surface S (see, FIGURE) and placed opposite each other.

The upper layer 6 of insulating material, placed on top of the layer 5, may incorporate a supply track 13 for the upper plate 11b.

According to the invention, the layer 4 of insulating material incorporates a metal screen 12 parallel to the surface S. The material of the screen 12 may be copper, aluminum, tungsten, tantalum or an alloy containing at least one of the above metals.

To guarantee that the operation of the capacitor 11 is protected effectively, the edges of the screen 12 must be located outside a projection, along the direction D, of the edges of the capacitor 11 in a plane containing the screen 12. It is furthermore recommended that the edges of the screen 12 be located at least 2 microns from the projection of the edges of the capacitor 11 in the plane containing the screen.

In the example described here, the dimensions of the screen 12 in a plane parallel to the surface S are chosen so that the screen 12 has a peripheral area of width d of about 10 microns extending beyond the line of a perimeter of the capacitor 11. Thus, the screen 12 may intercept any interference emitted by one of the semiconductor components 10 in the direction of the capacitor 11 along a direction P oblique to the direction D.

If one of the semiconductor components 10 is particularly sensitive to interference emitted by the capacitor 11, the edges of the screen 12 must therefore also be located outside a projection of the edges of the sensitive semiconductor component in a plane containing the screen. It is therefore also recommended that the edges of the screen 12 be located at least two microns from the projection of the edges of the sensitive semiconductor component.

Without reducing the ability of the screen 12 to protect the capacitor 11 from interference emitted by some of the semiconductor components 10, the screen may include openings 12a. These openings 12a, passing through the screen 12 between lower and upper faces of this screen 12, have respective widths of about 1 micron, measured parallel to the surface S. They are separated from each other by about 100 microns and allow hydrogen atoms to diffuse through the screen 12 along a direction D. Such hydrogen atoms are used in the fabrication of the electronic circuit, in particular to saturate pendant bonds that may be present at the interface between portions of silicon material and portions of silica of the electronic circuit.

Because of its proximity to the screen 12, the capacitor 11, and possibly each of the semiconductor components 10, may develop an interaction between the screen 12 which impairs its electrical behavior relative to a situation in which this capacitor or this semiconductor component is regarded in isolation. This interaction may be of capacitive, inductive or other type, and may be modeled by an equivalent circuit diagram. The equivalent circuit diagram is then taken into account when predicting the operation of the electronic circuit so as to meet, as far as possible, the application for which the electronic circuit is intended. In particular, one type of capacitor 11 and/or of each semiconductor component 10 may be chosen when considering this equivalent circuit.

In a preferred way of implementing this method of taking into account the influence of the screen on the operation of each electronic component, a library, of electrical characteristics of electronic components is established, in which each component is considered in the presence of a screen as described above. This library collects the characteristics of capacitors that can be used as capacitor 11 in the above baseband filter, and the characteristics of semiconductor components which can be used as semiconductor components 10. The types of capacitors and of semiconductor components, the electrical characteristics of which are contained in the library are distinguished, for example, by their respective geometrical dimensions, their shapes, their constituent materials, etc.

For each component, such electrical characteristics are obtained by electrical measurements supported on at least one prototype of this component produced with a screen on a substrate. These electrical characteristics are then introduced into the library for the purpose of their being used subsequently in the design of an electronic circuit. Thus, the electrical characteristics of the components contained in the library take account of the influence of the screen on the operation of these components.

In a known manner, when designing an electronic circuit, prior to the circuit being fabricated, a circuit designer simulates the operation of the circuit by means of especially adapted computer-aided design software packages. Such computer-aided design software packages use pre-established libraries of electrical characteristics of electronic components, and determine characteristics of the operation of the circuit by calculating electrical responses of the components of the circuit. Depending on these characteristics, the circuit designer modifies the types of certain components so as to adjust the operation of the circuit in respect of a predefined specification.

The use of electrical characteristics of components, determined in the presence of screens, makes it possible to take into account the influence of screens in the simulations. The electronic circuit operation thus simulated then agrees very exactly with the actual operation of the circuit. During the simulation, the choice of the types of component according to the results of the simulations allows the operation of the circuit to be very well optimized with respect to a specification.

To allow the influence of the screen on the operation of the electronic component to be taken into account as exactly as possible, a defined screen configuration type is set for all the component prototypes and is repeated for the screen 12 of the electronic circuit fabricated. Choosing a single screen configuration type makes it possible to avoid repeating each component in the library according to the type of screen with which this component is associated. The screen configuration type may be defined by common characteristics of screens, such as, for example, minimum screen dimensions in a plane parallel to the surface of the substrate, a screen thickness, an electrical resistivity of the constituent material of the screen, a distance separating the screen from the electronic component in question, etc.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

The invention claimed is:

1. An integrated electronic circuit comprising:
a substrate,
a capacitor and at least one semiconductor component which are supported by a surface of the substrate, the capacitor and the semiconductor component being placed substantially in line with each other along a direction perpendicular to the surface of the substrate wherein the capacitor is formed with at least one metallization level above the substrate, and
a substantially planar screen formed within a metallization level above and parallel to the surface of the substrate, made of a metallic material, and placed between the capacitor and the semiconductor component.

2. The circuit according to claim 1, wherein the screen includes openings.

3. The circuit according to claim 1, wherein edges of the screen are at least partially located outside a projection of edges of the capacitor in a plane containing the screen, along the direction perpendicular to the surface of the substrate.

4. The circuit according to claim 3, wherein the edges of the screen are located at least 2 microns from the projection of the edges of the capacitor, along a direction parallel to the direction of said plane containing the screen.

5. The circuit according to claim 1, wherein edges of the screen are at least partially located outside a projection of the edges of the semiconductor component in a plane containing the screen, along the direction perpendicular to the surface of the substrate.

6. The circuit according to claim 5, wherein the edges of the screen are located at least 2 microns from the projection of the edges of the semiconductor component, along a direction parallel to the direction of said plane containing the screen.

7. The circuit according to claim 1, wherein the semiconductor component is placed in proximity to the surface of the substrate, the circuit comprising several superposed layers of insulating material which cover the surface of the substrate and the semiconductor component, the capacitor being placed within at least one layer of insulating material above the semiconductor component, and wherein the screen is placed within at least one intermediate layer of insulating material between the surface of the substrate and the layer of insulating material within which the capacitor is placed.

8. The circuit according to claim 7, wherein the layer of insulating material, within which the screen is placed, is adjacent to the layer of insulating material within which the capacitor is placed.

9. The circuit according to claim 7, which furthermore includes metallic connections or resistors placed within additional layers of insulating material parallel to the surface of the substrate, wherein any included metallic connections or resistors in line with the capacitor are located on the opposite side of the screen to the capacitor.

10. The circuit according to claim 1, wherein the screen is electrically connected to a terminal raised to a defined electrical potential.

11. The circuit according to claim 1, wherein the material of the screen is chosen from a list of metals consisting of copper, aluminum, tungsten, tantalum, and an alloy containing at least one of the above metals.

12. A method of designing an integrated electronic circuit, comprising the following steps:
a) producing a plurality of integrated circuit prototypes each prototype comprising a substrate, a measurement capacitor formed in at least one metallization level above the substrate or a measurement semiconductor component of a respective defined type, at least one of the measurement capacitor and the measurement semiconductor being supported by a surface of the substrate, each prototype furthermore including a substantially planar screen parallel to the surface of the substrate, the screen being made of metallic material formed in a metallization level and placed in line with the at least one measurement capacitor and the measurement semiconductor component along a direction perpendicular to the surface of the substrate;
b) measuring respective electrical characteristics of the at least one measurement capacitor and the measurement semiconductor component for each of the prototypes;
c) performing simulations, by means of at least one computer-aided design software package for electronic circuits, of the operation of the electronic circuit using some of the measured electrical characteristics of the at least one measurement capacitor and the measurement semiconductor component;
d) selecting the selection of a type of capacitor or semiconductor component according to the results of the simulations; and
e) fabricating the electronic circuit with a capacitor or a semiconductor component of the selected type.

13. The method according to claim 12, wherein step c) comprises the following steps:
c1) generating electrical models associated with the at least one measurement capacitor and the measurement semiconductor component using the measured electrical characteristics; and
c2) performing of simulations using at least some of the electrical models generated.

14. An integrated circuit, comprising:
a semiconductor substrate including a semiconductor component;
a plurality of insulating layers stacked over the semiconductor substrate;
a capacitive structure formed in a first of said plurality of insulating layers; and
a metallic screen formed in a second of said plurality of insulating layers, the second insulating layer being located between the first insulating layer and the semiconductor substrate, the metallic screen inhibiting interference between the capacitive structure and the semiconductor component.

15. The circuit of claim 14 further including a resistive structure formed in a third of said plurality of insulating layers, the third insulating layer being located between the second insulating layer and the semiconductor substrate.

16. The circuit of claim 14 wherein the metallic screen and capacitive structure are vertically aligned and the metallic screen is shaped and sized to extend beyond an extent of the capacitive structure.

17. The circuit of claim 14 wherein the metallic screen and semiconductor component are vertically aligned and the metallic screen is shaped and sized to extend beyond an extent of the semiconductor component.

18. The circuit of claim 14 wherein the capacitive structure and the metallic screen are positioned generally above the location of the semiconductor component.

19. The circuit of claim 14 wherein the capacitive structure and the metallic screen are aligned with each other in a direction perpendicular to a surface of the semiconductor substrate.

20. The circuit of claim 14 wherein the metallic screen includes a plurality of openings passing therethrough which are filled with an insulating material of the second insulating layer within which the metallic screen is formed.

21. An interference protection device for an integrated circuit, comprising:
a metallic screen positioned in a first insulating layer above a semiconductor substrate and located between a semiconductor component in the substrate and a capacitive structure positioned in a second insulating layer above the semiconductor substrate.

22. The device of claim 21 wherein the metallic screen is tied to a voltage potential.

23. The device of claim 21 wherein the metallic screen is located between the capacitive structure and a resistive component.

24. The device of claim 23 wherein the resistive component is located within a third insulating layer positioned under the first insulating layer for the metallic screen.

25. The device of claim 21 wherein the capacitive structure is located within the second insulating layer positioned above the first insulating layer for the metallic screen.

26. The device of claim 21 wherein the capacitive structure and metallic screen are superposed above the semiconductor component.

27. The device of claim 21 wherein the metallic screen and semiconductor component are vertically stacked and the metallic screen is shaped and sized to extend beyond an extent of the semiconductor component.

28. The device of claim 21 wherein the metallic screen and semiconductor component are vertically stacked and the metallic screen is shaped and sized to extend beyond an extent of the semiconductor component.

29. The device of claim 21 wherein the metallic screen includes a plurality of openings passing therethrough which are filled with an insulating material which are filled with an insulating material of the first insulating layer within which the metallic screen is formed.

* * * * *